United States Patent
Oprescu et al.

(10) Patent No.: US 6,169,506 B1
(45) Date of Patent: Jan. 2, 2001

(54) OVERSAMPLING DATA CONVERTER WITH GOOD REJECTION CAPABILITY

(75) Inventors: Florin A. Oprescu, Sunnyvale; William C. Rempfer, Los Altos, both of CA (US)

(73) Assignee: Linear Technology Corp., Milpitas, CA (US)

( * ) Notice: Under 35 U.S.C. 154(b), the term of this patent shall be extended for 0 days.

(21) Appl. No.: 09/135,161

(22) Filed: Aug. 17, 1998

(51) Int. Cl.⁷ ...................................................... H03M 3/00
(52) U.S. Cl. ............................................. 341/143; 341/155
(58) Field of Search .................................. 341/143, 155, 341/139

(56) References Cited

U.S. PATENT DOCUMENTS

| | | | |
|---|---|---|---|
| 5,134,401 | 7/1992 | McCartney et al. | 341/143 |
| 5,349,352 | * 9/1994 | Saleh | 341/143 |
| 5,757,867 | * 5/1998 | Caulfield et al. | 375/350 |

OTHER PUBLICATIONS

Principles of Oversampling A/D Conversion, Max Hauser, J. Audio Eng. Soc., vol. 39, No. ½, 1991.

On the Use of Modulo Arithmetic Comb Filters in Sigma Delta Modulators, IEEE Proc. ICASSP '88, pp. 2001–2004, Apr. 1988.

* cited by examiner

*Primary Examiner*—Peguy JeanPierre
(74) *Attorney, Agent, or Firm*—Fish & Neave; Robert W. Morris; Joel Weiss

(57) ABSTRACT

An oversampling data converter with good rejection capability is provided. The oversampling data converter includes three primary parts; a delta-sigma modulator for sampling and digitizing incoming analog signals, a high order digital filter for discarding unwanted frequency components, and an internal clock generator for controlling the operation of the modulator and the filter. All three primary parts are provided in the same package and also on the same die. No frequency-setting external components are necessary. The high order digital filter provides more than 100 dB rejection at a first null frequency. The first null provided by the filter has a sufficiently broad range so as to allow a low accuracy internal clock generator to be used. If necessary, the clock can be generated externally or from some other part of the system.

26 Claims, 7 Drawing Sheets

OVERSAMPLING DATA CONVERTER WITH GOOD REJECTION CAPABILITY

BACKGROUND OF THE INVENTION

The present invention addresses the rejection of unwanted frequency components present in a given real world analog signal when such a signal is converted to a digital representation. This problem is of practical importance in such fields as data acquisition, test and measurement equipment, industrial control, etc. In particular, the invention describes the implementation of an oversampled data converter which maintains very good unwanted signal rejection while using a relatively imprecise internal clock reference.

In many applications a real world signal is converted into a stream of digital samples through the use of an analog-to-digital converter (ADC). A common implementation may include an analog domain filter, the ADC, a master clock, and a digital filter. The input signal passes through the analog domain filter which eliminates a portion of the unwanted frequency components and creates an analog filtered signal. The analog filtered signal is then sampled under the control of a clock signal from the master clock and each sample is converted into a digital representation by the ADC. The ADC output is a stream of digital samples that form a digital domain representation of the filtered signal. Afterwards, the stream is processed by the digital filter which then produces the output signal. The objective of the digital filter is to further remove from the stream unwanted frequency components. The digital filter operation also is controlled by a clock signal which is synchronous with the ADC clock signal. Due to excessive complexity, in many early implementations, the digital filter is absent or performs only a simple averaging function.

However, such applications of an analog-to-digital converter, even while using very accurate, and therefore expensive components, display only moderate performance capabilities. Thus, new methods of converting analog signals to digital signals are sought after.

One method of improving analog-to-digital conversion is by using an oversampling type converter. By oversampling (taking samples of the analog signal at a rate higher than the Nyquist rate [two times the frequency of the signal]) many of the operations of the converter, such as antialiasing, quantizing and filtering may be improved. In addition, oversampling by the converter enables the transfer of some of the analog filter functions to the digital filter where they can be implemented with greater accuracy and increased integration (The word "integrated" and "integration" in this application are used to describe internal, or "on-the-chip," components). However, the prior art has not considered combining an oversampling converter with a high order digital filter in order to be able to use a low accuracy clock signal. The previous implementations have always relied upon clock signals with relatively high frequency accuracy whenever the rejection of certain frequency components of the input signal is important.

In addition, prior art implementations have not considered that a minimal increase in the digital filter complexity restores the converter rejection capabilities even when a low accuracy frequency clock reference is used.

SUMMARY OF THE INVENTION

It is an object of this invention to provide an oversampling data converter utilizing a low accuracy internally generated clock signal.

It is a further object of this invention to provide an oversampling data converter implementing a slight increase in the digital filter complexity which allows the converter to utilize a low accuracy internally generated clock signal.

In accordance with this invention, an oversampling analog-to-digital converter is provided. The analog-to-digital converter includes a delta-sigma modulator for sampling the analog signal and producing a digital output signal, a high order digital filter for removing unwanted frequency components from the digital output signal, and a low accuracy internal clock generator for controlling the delta-sigma modulator and the high order digital filter.

DETAILED DESCRIPTION OF THE INVENTION

The Prior Art

Early implementations of analog-to-digital converters relied almost exclusively on an analog filter for eliminating unwanted frequency components. Such an approach, however, has only moderate performance capabilities when compared with its complexity and low level of integration, i.e., precise analog components cannot be easily fabricated using current typical semiconductor fabrication technology.

In numerous later configurations, the analog-to-digital converter utilized is an oversampling type of converter which greatly simplifies the system filtering requirements. In addition, as a substitute for the filtering operation of the analog filter, this approach places more emphasis on the digital filter for the rejection of unwanted frequencies. However, the possible effect of the utilization of a high order filter in an oversampling converter on the required accuracy of the frequency reference has not been considered.

One drawback to utilizing a lower order digital filter in the converter is that the lower order filter may require highly accurate clock signals. The following example illustrates the burden a lower order digital filter places on its timing equipment, i.e., its clock signal generator. One known oversampling analog-to-digital converter is the AD7714, manufactured by Analog Devices Inc. of Norwood, Mass., which implements a digital filter with a sinc$^3$ type frequency characteristic.

In oversampling data converters such as the AD7714, one preferred characteristic is that the digital filter provides more than 100 dB rejection at its first null frequency. The sinc$^3$ type filter used in the AD7714 provides better than 100 dB rejection in the frequency range Fo−2.11% to Fo+2.2% (Fo is the value of the first null in the filter frequency domain transfer characteristic and it is directly derived from the system frequency Fs.) In practical implementations of these data converters, the digital filter maintains its first null frequency rejection band at the line frequency (typically about 50 Hz or about 60 Hz).

Generally, the local power provider guarantees the line frequency with a +/−2% absolute accuracy. The 100 dB rejection at the first null must cover the entire +/−2% of the line frequency for the digital filter to be effective. The 100 dB first null, however, only extends from Fo−2.11% to Fo+2.2%. Therefore, it can be immediately derived from the above statements that, in order to provide an effective digital filter, the system frequency Fs must have an absolute accuracy better than 0.15%. This can be achieved using an external frequency reference device (e.g. a quartz crystal, a ceramic resonator, an external oscillator, etc.). However, such an approach increases the system cost, size and power consumption of the implementation.

Figure 1:
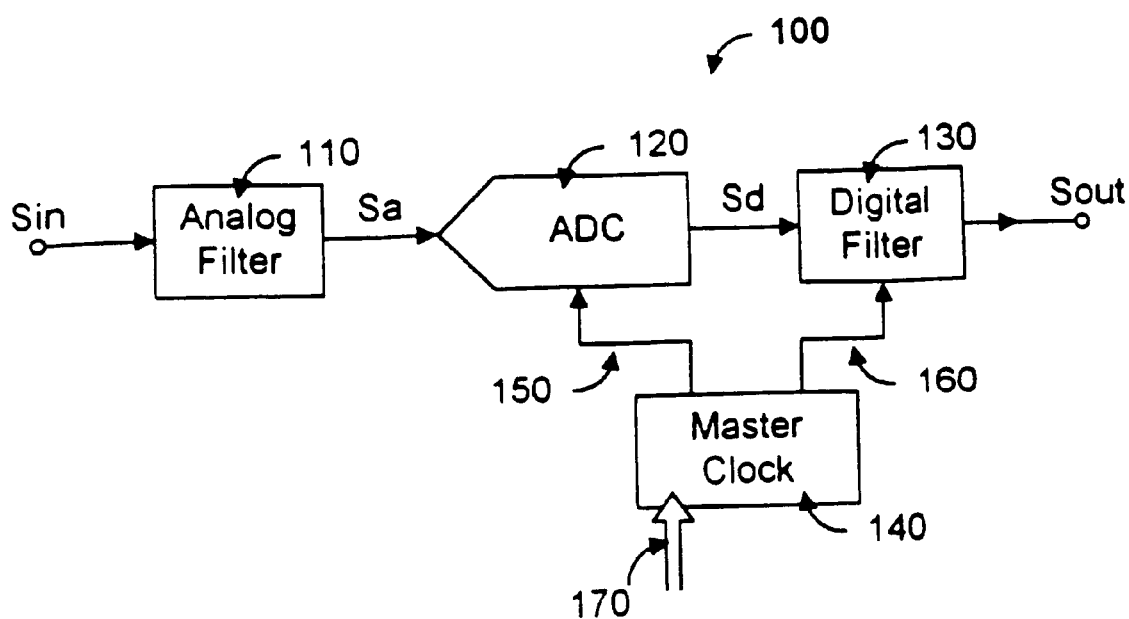
FIG. 1 is a block diagram of a known system for converting analog signals to digital signals.

An early implementation of a known analog-to-digital converter 100 is shown in FIG. 1. The input signal Sin passes through an analog filter 110 which eliminates a portion of the unwanted frequency components and creates output analog filtered signal Sa. The analog signal Sa is then sampled by ADC 120 under the control of a clock signal 150 produced by master clock 140. Each sample is then converted into a digital representation by ADC 120. The converter output Sd is a stream of digital samples which form a representation of the analog signal Sa. The stream Sd is afterwards processed by an optional digital filter 130 to further remove unwanted frequency components from the stream Sd. The digital filter operation is controlled by a clock signal 160 produced by master clock 140. Clock signal 160 is synchronous with clock signal 150. In some known configurations of the prior art, master clock 140 is controlled through an external interface 170.

As mentioned above, converter 100 relies almost exclusively on analog filter 110 for eliminating unwanted frequency components. An optional digital filter 130, when present, may perform a simple averaging function (equivalent with a $sinc^1$ filter function). Such an approach, even while using very accurate, hence, very expensive components, has only moderate performance capabilities when compared with its complexity and level of integration.

In addition, numerous known configurations of analog-to-digital converter 100 utilize an oversampling type converter which greatly simplifies and sometimes even eliminates analog filter 110. Oversampling type converters support operations of antialiasing, sampling, and quantizing an analog input signal. As mentioned above, however, the effect of the use of $sinc^4$ filters or their functional equivalents on required clock reference signals necessary for operation of an oversampling converter has not been considered. Indeed, the added complexity and expense these filters introduced to the converter has been considered impractical without creating a significant advantage.

The Invention

The present invention improves the rejection capabilities of a data converter while being able to use a less accurate master clock generator, as will be explained. Therefore, the invention obviates the need for a high accuracy external clock signal generator. This approach, by allowing a low accuracy clock signal to be used, produces an implementation that is more compact, less expensive and consumes less power than known implementations because the clock signal can be generated internally, i.e., in the same package with the data converter or even on the same die.

In a data converter constructed according to the present invention, the analog input signal is processed by a delta-sigma modulator under the control of a first clock signal and converted into a digital stream. The digital stream is further processed by a high order digital filter under the control of a second clock signal. Both clock signals may preferably be generated by a low accuracy internal clock generator. If necessary, operation of the internal clock generator can be controlled through an external frequency reference which may preferably generate low accuracy signals.

According to the present invention, the filtering burden preferably falls upon the digital filter. The digital filter frequency characteristic is directly controlled by the digital filter clock frequency and through it by an internally generated master clock generator frequency reference. Thus, the frequency value of the digital filter null Fo is a certain ratio of the master clock generator frequency reference. A certain error in the master clock generator frequency reference translates directly into a proportional error in Fo.

As mentioned concerning the AD7714, the data converter's effective function requires that the digital filter produce better than 100 dB of rejection at its first null. To achieve this goal, the present invention preferably combines a digital filter which is of a marginally higher order than those used in the AD7714 with a low accuracy internal clock generator. Because a high order filter is used, the rejection of the data converter can be maintained at a sufficient level even though the internal clock generator may be low accuracy. This is because the high order filter creates a wider band of rejected frequencies at the first null. Therefore, the clock generator's accuracy requirement is reduced because more unwanted frequencies are rejected by the digital filter. Though the clock generator may be less accurate, the digital filter prevents those inaccuracies from affecting the data converter output because those inaccuracies are eliminated by the digital filter. Thus, a distinct advantage is realized by using a high order digital filter in the invention because the accuracy requirement on the clock generator is reduced.

While a high order digital filter may necessarily be more complex, the advantage provided by reducing the accuracy requirement for the clock generator outweighs the complication created by the added complexity. In fact, the additional complexity of the high order digital filter can be absorbed with negligible impact by present integrated circuit technology.

Implementations of 1) low accuracy clock generators (i.e., clock generators that produce clock signals less accurate than +/−0.5% of the desired clock frequency, such as clock generators that produce signals accurate to +/−1.0%, +/−1.5%, +/−2.0%, +/−2.5%, etc.), or 2) clock generators that produce clock signals having relatively higher accuracy, but whose signals when divided to produce the desired clock frequency are outside of the frequency band by +/−0.5% or greater ("low accuracy" as used throughout this application refers to these two categories numbered above), are quite common in both discrete and integrated forms. This availability of low accuracy clock generators allows simple and cheap implementation of the invention. Such a frequency generator can be implemented in an integrated form using dedicated on-chip trimmed components or off-chip low accuracy components. Delta-sigma modulators provide the analog-to-digital conversion in the invention. Implementations of delta-sigma modulators have been often described in such papers as "Principles of Oversampling A/D Conversion," by Max Hauser in *J. Audio Eng. Soc.*, Vol. 39, No. ½, 1991). Similarly, many implementations of higher order sinc$^n$ type filters are described in the available literature (e.g., E. Dijkstra et al., "On the Use of Modulo Arithmetic Comb Filters in Sigma Delta Modulators," *IEEE Proc. ICASSP'88*, pp. 2001–2004, April 1988).

In an alternative embodiment of the present invention, clock signals already present in the system environment of the converter may be substituted for a dedicated clock signal generator. Indeed, the probability of being able to find a frequency reference signal common with other components in the system or of being able to derive the necessary signal using simple counter dividers from existing frequency reference signals is greatly increased by the relaxed frequency accuracy requirement.

Typically, the first null frequency, Fo, is directly proportional to the clock generator frequency Fs. Nevertheless, it may be desirable for the first null frequency of the filter to be programmable. An example of such an application is line frequency rejection for an international market where, depending on the specific country, the absolute frequency of the power lines may be about 50 Hz or about 60 Hz. In the described architecture, when the internal clock generator is fully integrated (i.e., together on the same chip with the data converter), an external clock interface may be necessary for programming the first null.

Figure 2:
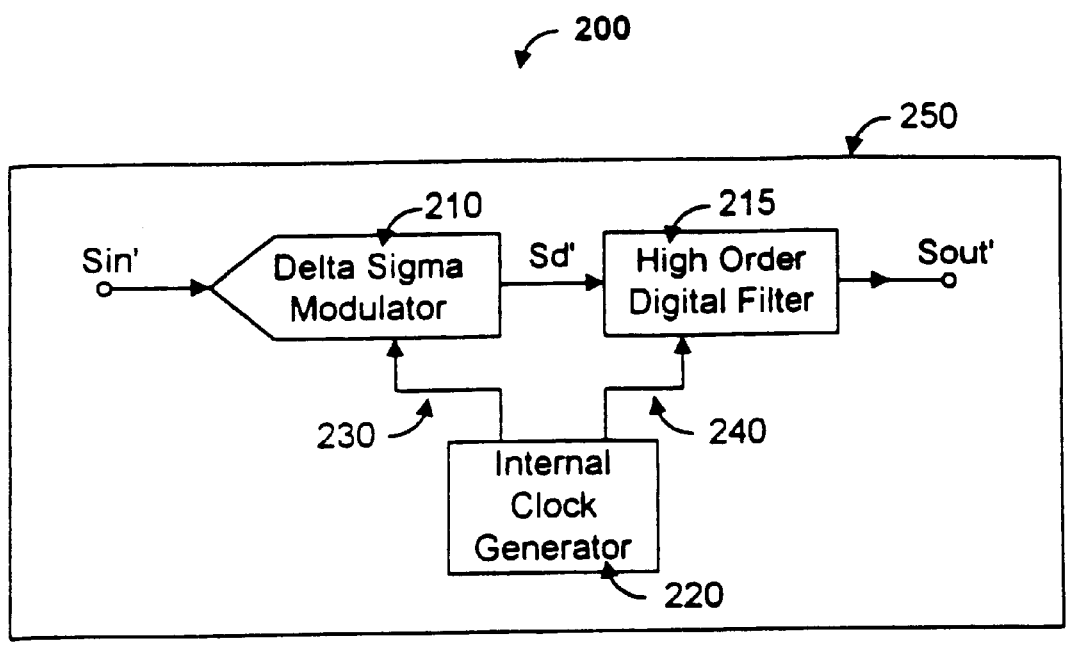
FIG. 2 is a block diagram of an oversampling data converter with a high order digital filter according to the principles of the invention.

FIG. 2 shows one embodiment of the present invention. Oversampling data converter 200 combines a delta-sigma modulator 210 for digitizing incoming analog signals, a high order digital filter 215 for rejecting unwanted frequency components and a low accuracy internal clock generator 220 for controlling the operation of delta-sigma modulator 210 and high order digital filter 220. The box 250 represents a single package in which data converter 200 can be implemented using no external frequency-setting components. Box 250 can also represent a single die on which data converter 200 is located.

An analog input signal, Sin', is processed by delta-sigma modulator 210 under the control of a first clock signal 230 (received from internal clock generator 220) and converted into a digital stream, Sd'. The digital stream, Sd', is further processed by high order digital filter 215 under the clock control of a second clock signal 240 (also received from internal clock generator 220), synchronous to first clock signal 230, and output as a digital output signal Sout'.

Figure 2A:
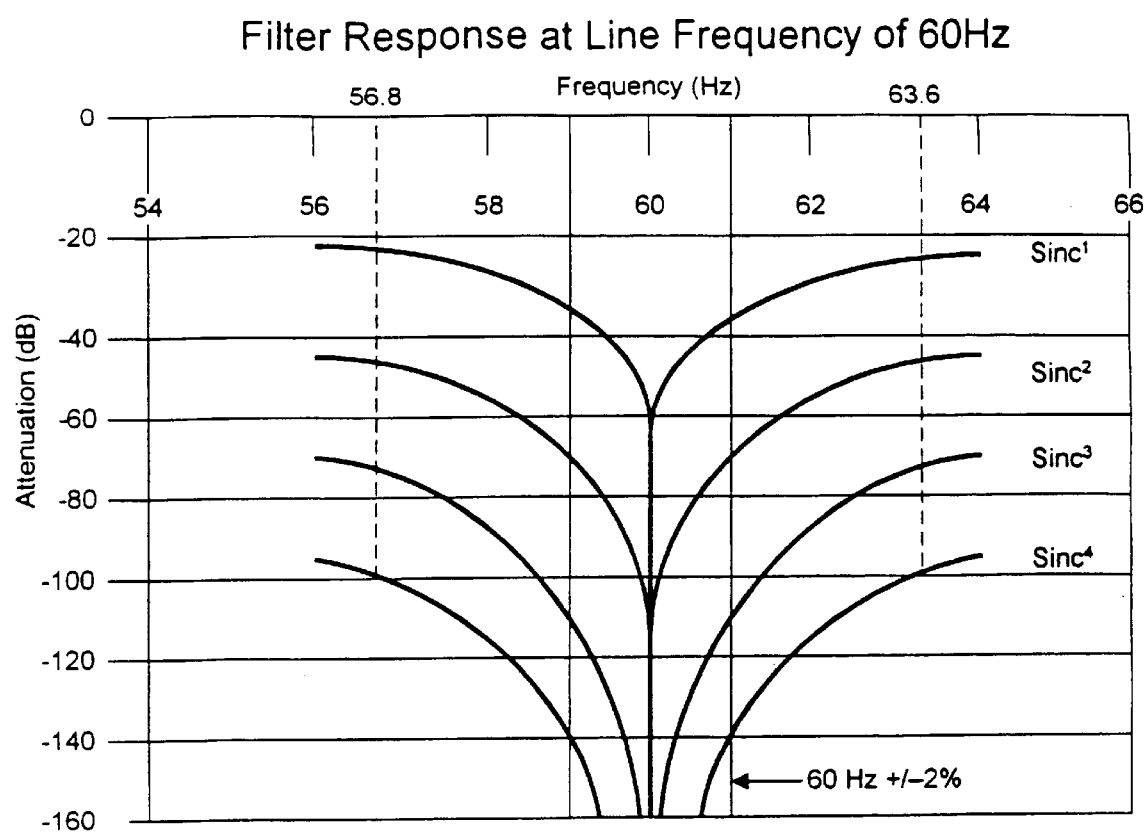
FIG. 2a is a table of filter responses for different orders of filters.

Use of high order digital filter 215, as shown in FIG. 2, increases the breadth of the band of rejected frequencies at the first null (see table in FIG. 2a which indicates that the width of the null increases as the order of the filter increases, i.e., the sinc$^4$ filter attenuates a broader band around the given first null of 60 Hz than the sinc$^3$ filter, etc.). This allows internal clock generator 220 to function at low accuracy because more unwanted frequencies are rejected at the filter's first null. Reducing the accuracy requirements on clock generator 220 creates the possibility of producing timing signals for data converter 200 internally, i.e., with internal clock generator 220. In prior art, when high accuracy signals were required, an external high accuracy clock generator was utilized. In the present invention, the problem of producing high accuracy signals is overcome through the use of high order digital filter 215. High order filter 215 widens the rejection band at the first null, which relaxes the accuracy requirement on clock generator 220, and permits the timing signal to be produced internally, i.e., on the same chip as data converter 200. This reduces power consumption, die area, and system cost.

Figure 3:
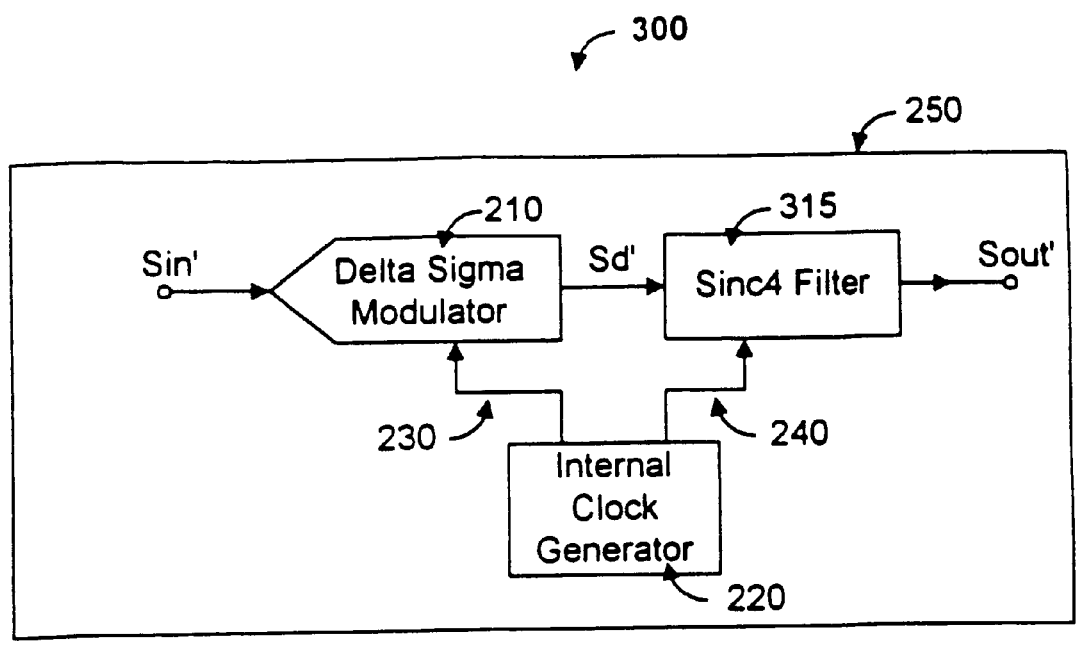
FIG. 3 is a block diagram of an oversampling data converter with a sinc$^4$ digital filter according to the principles of the invention.

FIG. 3 shows one embodiment of the present invention in which data converter 300 includes a sinc$^4$ type filter 315. Sinc$^4$ type filter 315 is preferably combined with delta sigma modulator 210 and low accuracy internal clock generator 220, as shown in FIG. 3. Sinc$^4$ type filter 315 provides better than 100 dB of rejection at its first null for a frequency range of about Fo–5.3% to about Fo+6.0% (see table in FIG. 2a, which illustrates that the sinc$^4$ filter provides at least 100 dB of rejection from about 56.8 Hz to about 63.6 Hz). In order to accommodate the +/–2% absolute accuracy of an external perturbation frequency (like the line frequency discussed above) a clock reference with an accuracy of only about +/–3.3% is required. The relatively low requirement of +/–3.3% accuracy increases the probability of finding a suitable reference signal already in the system.

Figure 4:
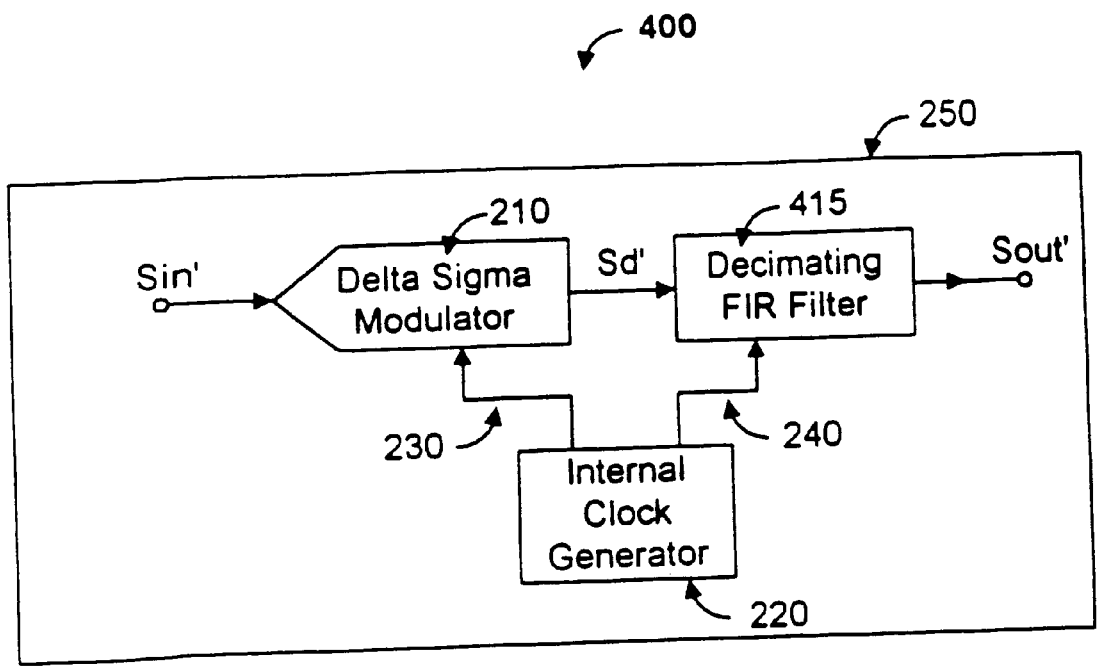
FIG. 4 is a block diagram of an oversampling data converter with a decimating FIR filter according to the principles of the invention.

FIG. 4 shows a preferred embodiment of a data converter 400 according to the invention incorporating a different type of high order digital filter. This filter is known as a decimating finite impulse response (FIR) filter 415, and is described in co-pending, commonly-assigned patent application, "Hardware Implementation of a Decimating Finite Impulse Response Filter," application Ser. No. 09/135,229, which is hereby incorporated by reference in its entirety. In this embodiment, the frequency of the converter clock signal, Fs, may be about 153600 Hz in order to obtain line frequency rejection at a first null, Fo, of 60 Hz (Fs=Fo*N*M=60 Hz*256*10=153600 Hz, taking Fo=60 Hz for line frequency [where the first null may preferably be required,] N=256, [N being a factor determined by the digital filter construction,] and M being an additional binary modulo M counter having M=10 for the specific implementation described in that application). The absolute accuracy of the clock signal for this embodiment is required to be only about +/–3%, because the decimating FIR filter 415 functions similarly to the sinc$^4$ filter described above, while still maintaining the desired rejection level. Therefore, one can utilize a low accuracy clock generator, i.e., internal clock generator 220, to control decimating FIR filter 415 and still effectively filter the digital stream, Sd'.

Figure 5:
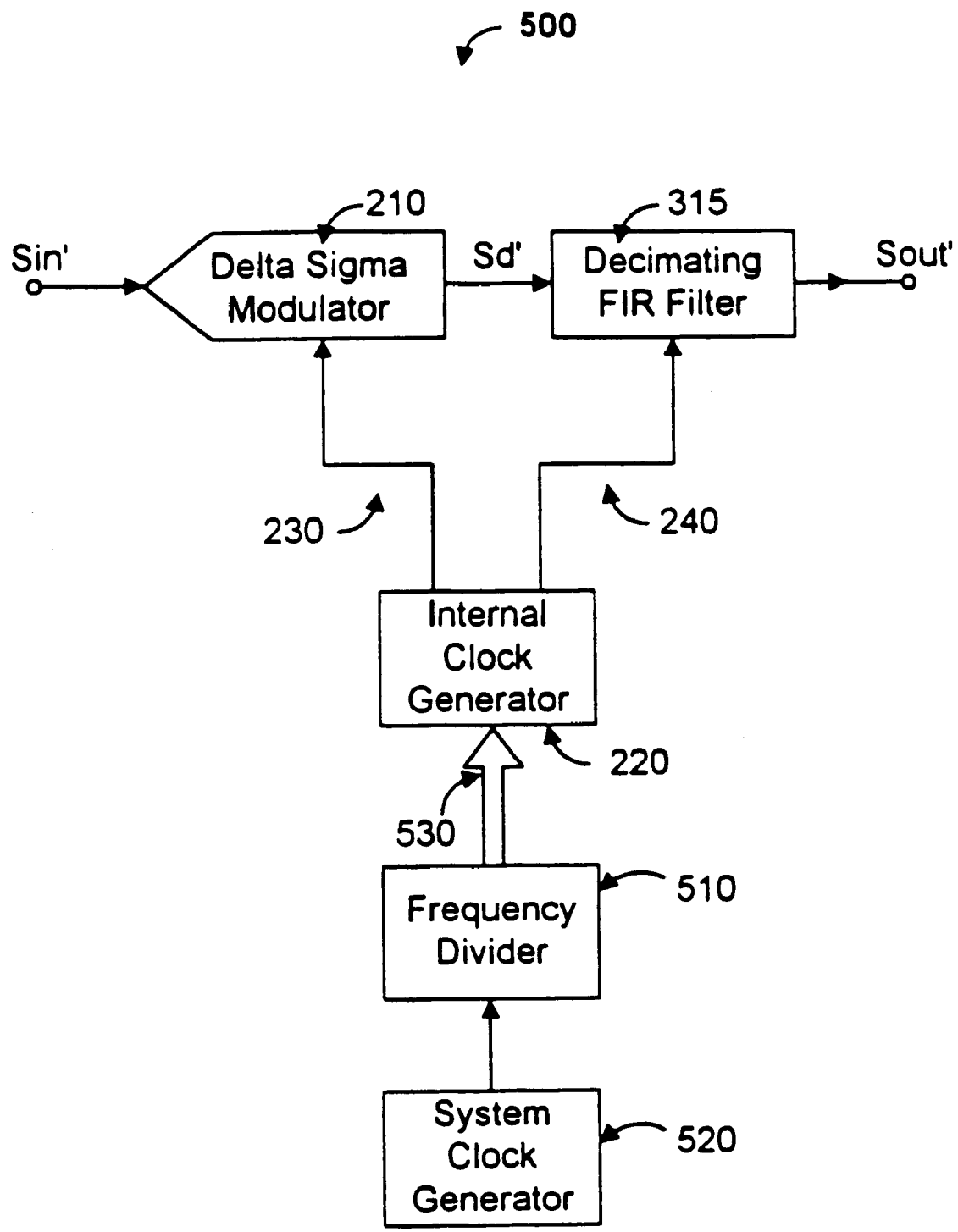
FIG. 5 is a block diagram of an oversampling data converter with a system clock generator according to the principles of the invention.

FIG. 5 shows an alternative embodiment of the data converter described in FIGS. 2–4. This data converter 500 uses clock signals already present in the data conversion system. These clock signals could be available on the same die as data converter 500, or in the general area of the circuit in which data converter 500 is being incorporated. In FIG. 5, these clock signals are produced by a system clock generator 520 which is available within the system. These clock signals may be substituted for clock signals produced by a dedicated clock signal generator. These clock signals may be accessed with internal clock generator 220 through external clock control interface 530, as shown in FIG. 5. As mentioned above, the probability of being able to find a frequency reference signal common with other components in the system or of being able to derive the necessary signal using simple counter dividers from existing frequency reference signals is greatly increased by the relaxed frequency accuracy requirement of the invention.

For example, FIG. 5 shows an embodiment of the invention which utilizes a system clock generator 520. System clock generator 520 shown in FIG. 5 has a frequency of about 5 MHZ+/–0.2%. (However, another system clock generator with a suitable frequency may also be used without departing from the spirit of the invention.) Using a commonly available frequency divider 510, i.e., a modulo 32 counter, to reduce the frequency of the signal, a frequency reference of 156250 Hz with an absolute accuracy of +/–0.2% is obtained. This value is well within the desired frequency reference range of 153600 Hz+/−3% required by data converter 500.

Using even more complex filters, and thus further reducing the accuracy requirements for the clock generator, one can extend the proposed architecture.

Figure 6:
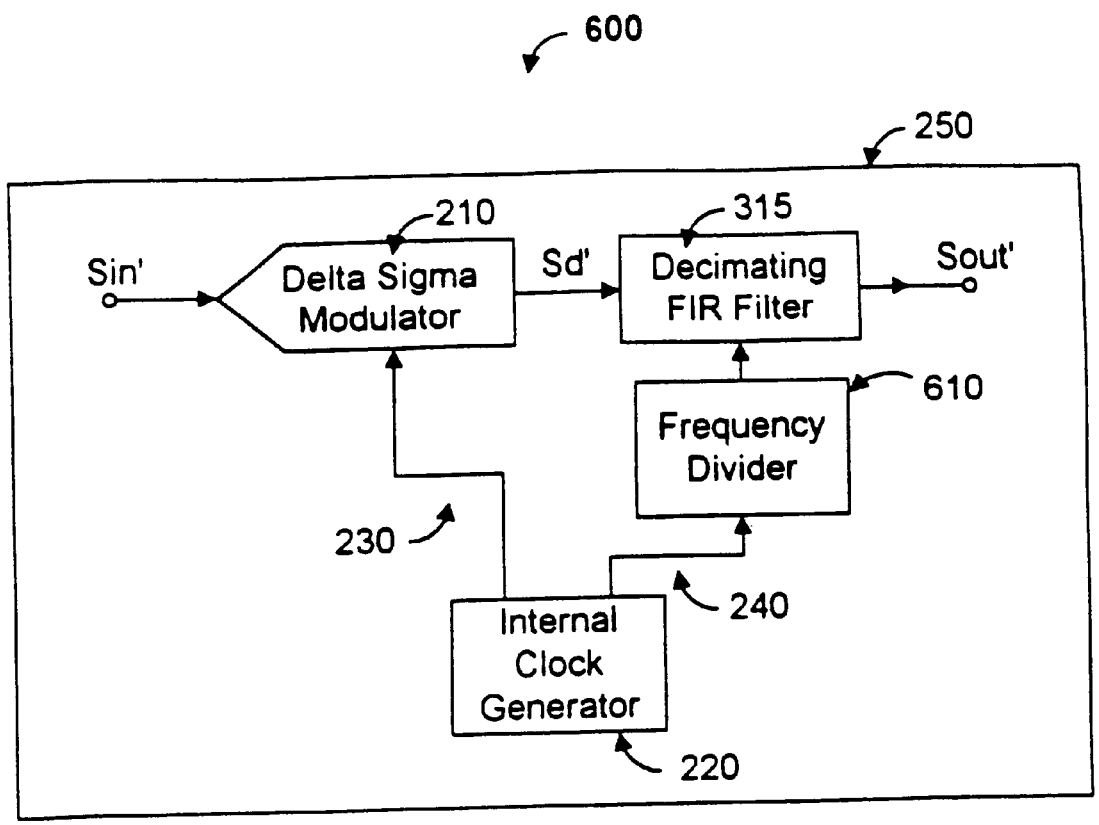
FIG. 6 is a block diagram of an oversampling data converter with a frequency dividing counter according to the principles of the invention.

FIG. 6 shows a data converter 600 that has a programmable first null frequency. Typically, the first null frequency, Fo, is directly proportional to the clock generator frequency Fs. Nevertheless, it may be desirable for the first null frequency of the filter to be programmable. An example of such an application is line frequency rejection for an international market where, depending on the specific country, the absolute frequency of the power lines may be about 50 Hz or about 60 Hz. To implement programmability to the data converter, with internal clock generator 220 being fully integrated, a frequency divider may be required between internal clock generator 220 and external clock interface 250, as shown in FIG. 6.

The factors which affect the first null frequency are shown by the equation Fs=Fo*N*M'. It follows from this equation that the frequency of the filter's first null Fo may be derived from the internal clock frequency Fs divided by N*M' such that Fo=Fs/(N*M'). (The division factor N, as mentioned above, is determined by the digital filter construction. The other division factor, M', is determined by an additional frequency divider 610, i.e., a modulo M' divider, placed between internal clock generator 220 and decimating FIR filter 415, or some other suitable high order filter.)

For decimating FIR filter 415, N is equal to 256 and M' is equal to 10. The division Fs/(N*M') is performed by the filter state controller as described in detail in the "Hardware Implementation of a Decimating Finite Impulse Response Filter" patent application. The resulting signal of frequency Fs/M' controls the operation of the digital filter.

Programmability of the value of M' allows the first null of the filter to be programmed. For example, when M' is programmed to equal 10, the combined division factor M'*N equals 2560, which results in a first null frequency of about Fo=60 Hz. When M' is programmed to be 12, the combined division factor M'*N=3072 which results in a first null frequency of about Fo=50 Hz.

In FIG. 6, the output of the internal clock generator 220 is first divided by a frequency divider 610, i.e., a modulo M' divider, and the resulting signal of frequency Fs/M' controls the operation of the digital filter. The value of the counter division ratio M' may be defined by the external clock control interface 530 as M'=10 or M'=12. Specifically, if a single external control line located within external clock control interface 530 is kept in a logic "0" state than internal clock generator 220 transmits a signal to a frequency divider such that M'=10, while if the same external control line is maintained in a logic "1" state than internal clock generator 220 transmits a signal to a frequency divider such that M'=12.

In the embodiment shown in FIG. 6, which includes decimating FIR filter 415, the internal clock generator frequency Fs is maintained constant at about Fs=153600 Hz. In such an embodiment, when the external control line is in a "0" logic state, the combined division factor M'*N=2560, which results in a first null frequency of about Fo=60 Hz. When the external control line is in a "1" logic state the combined division factor M'*N=3072 which results in a first null frequency of about Fo=50 Hz.

External clock control interface 530 can be expanded to select a larger number of possible values for the first null frequency Fo for any particular embodiment of the high order digital filter without departing from the spirit of the invention.

Thus it is seen that an oversampling data converter with good rejection capability which lowers the required accuracy of the clock reference, thereby providing the opportunity to utilize an internal clock, has been provided.

One skilled in the art will appreciate that the present invention can be practiced by other than the described embodiments, which are presented for purposes of illustration and not of limitation, and the present invention is limited only by the claims which follow.

What is claimed is:

1. An oversampling data converter having an input and an output, said oversampling data converter comprising:

a delta-sigma modulator having an input connected to said oversampling data converter input, and an output;

a high order digital filter having an input coupled to said delta-sigma modulator output, and an output coupled to said oversampling data converter output; and an independent low accuracy internal clock generator, said internal clock generator being connected to said delta-sigma modulator and said high order digital filter such that signals from said internal clock generator control said delta-sigma modulator and said high order digital filter.

2. The oversampling data converter defined in claim 1 wherein said internal clock generator is controlled through an external clock interface.

3. The oversampling data converter defined in claim 2 wherein said external clock interface is controlled by an external clock generator.

4. The oversampling data converter defined in claim 3 wherein said external clock generator is connected to said external clock interface by a frequency divider.

5. The oversampling data converter defined in claim 2 wherein said external clock interface is controlled by a system clock generator.

6. The oversampling data converter defined in claim 5 wherein said system clock generator is connected to said external clock interface by a frequency divider.

7. The oversampling data converter defined in claim 1 wherein said high order digital filter comprises a decimating FIR filter.

8. The oversampling data converter defined in claim 1 wherein said high order digital filter comprises a digital $sinc^4$ filter.

9. The oversampling data converter defined in claim 1 wherein a first null frequency of said high order digital filter is programmable.

10. The oversampling data converter defined in claim 1 wherein said internal clock generator is connected to said high order digital filter by a frequency divider.

11. The oversampling data converter defined in claim 10 wherein said frequency divider is programmable such that changing a counter division ratio of said frequency divider changes a value of a first null frequency.

12. The oversampling data converter defined in claim 1 wherein said delta-sigma modulator, said high order digital filter, and said internal clock generator are all implemented in a single package.

13. The oversampling data converter defined in claim 1 wherein said delta-sigma modulator, said high order digital filter, and said internal clock generator are all located on a single die.

14. A method for converting analog signals to digital signals comprising:

oversampling said analog signals to create analog samples;

digitizing said analog samples to create a digital stream;

filtering said digital stream with a high order digital filter to create said digital signals; and providing independent low accuracy internally generated control signals to control said steps of oversampling, digitizing, and filtering.

15. The method defined in claim 14 wherein said step of oversampling is characterized by use of a delta-sigma modulator.

16. The method defined in claim 14 wherein said step of digitizing is characterized by use of a delta-sigma modulator.

17. The method defined in claim 14 wherein said step of providing internally generated control signals is controlled by providing externally generated control signals.

18. The method defined in claim 17 wherein said step of providing externally generated control signals is controlled by providing signals from a system clock generator.

19. The method defined in claim 18 wherein said step of providing signals from a system clock generator further comprises adjusting the rate of said signals from said system clock generator.

20. The method defined in claim 14 wherein said step of filtering is characterized by use of a decimating FIR filter.

21. The method defined in claim 14 wherein said step of filtering is characterized by use of a digital $sinc^4$ filter.

22. The method defined in claim 14 wherein said step of filtering further comprises programming the first null frequency of said higher order digital filter.

23. The method defined in claim 14 wherein said step of providing internally generated control signals further comprises adjusting said control signals with a frequency divider.

24. The method defined in claim 23 wherein said frequency divider is programmable such that adjusting said frequency divider changes a value of a first null frequency.

25. The method defined in claim 14 wherein said steps of oversampling, digitizing, filtering, and providing internally generated control signals are all provided by components located within a single package.

26. The method defined in claim 14 wherein said steps of oversampling, digitizing, filtering, and providing internally generated control signals are all provided by components located on a single die.

* * * * *

UNITED STATES PATENT AND TRADEMARK OFFICE
CERTIFICATE OF CORRECTION

PATENT NO. : 6,169,506 B1
DATED : January 2, 2001
INVENTOR(S) : Oprescu, et al.

It is certified that error appears in the above-identified patent and that said Letters Patent is hereby corrected as shown below:

Column 1,
Line 42, please change "the frequency" to -- the highest frequency --.

Column 5,
Line 34, please change "digital filter 220" to -- digital filter 215 --.

Column 6,
Line 64-65, please change "modulo 32" to -- modulo 32 --.

Column 7,
Line 16-17, please change "external clock interface 250" to
-- decimating FIR filter 415 --.

UNITED STATES PATENT AND TRADEMARK OFFICE
CERTIFICATE OF CORRECTION

PATENT NO.    : 6,169,506 B1
DATED         : January 2, 2001
INVENTOR(S)   : Oprescu, et al.

Page 2 of 3

It is certified that error appears in the above-identified patent and that said Letters Patent is hereby corrected as shown below:

Drawing,
Fig.5, should appear as attached:

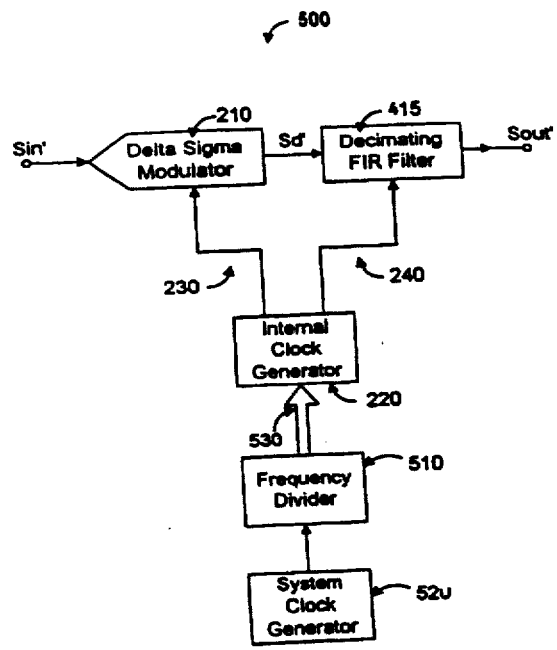

FIG. 5

UNITED STATES PATENT AND TRADEMARK OFFICE
CERTIFICATE OF CORRECTION

PATENT NO. : 6,169,506 B1
DATED : January 2, 2001
INVENTOR(S) : Oprescu, et al.

It is certified that error appears in the above-identified patent and that said Letters Patent is hereby corrected as shown below:

Drawing,
Fig. 6, should appear as follows:

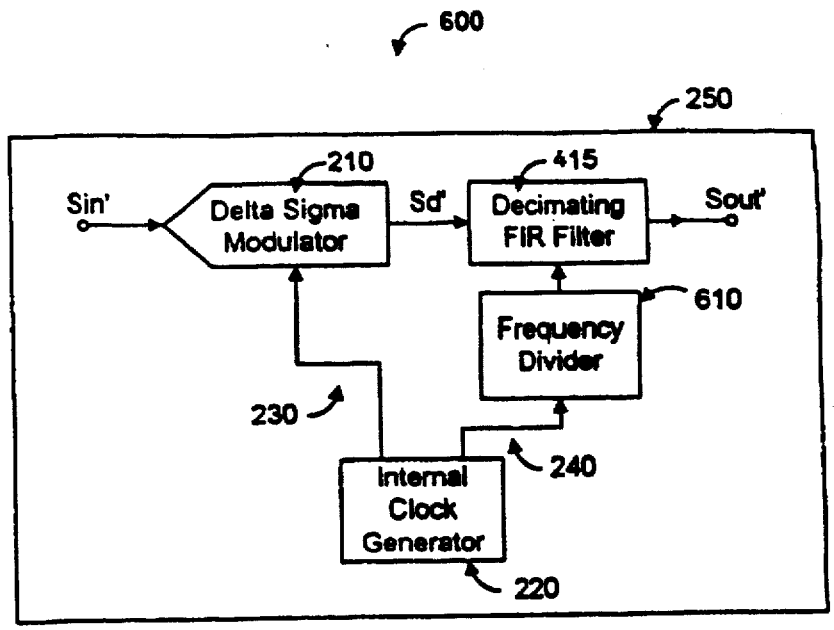

FIG. 6

Signed and Sealed this

Sixth Day of November, 2001

Attest:

NICHOLAS P. GODICI
Attesting Officer      Acting Director of the United States Patent and Trademark Office